United States Patent
Cheng et al.

(10) Patent No.: US 11,538,811 B2
(45) Date of Patent: Dec. 27, 2022

(54) DYNAMIC RANDOM ACCESS MEMORY AND METHOD OF MANUFACTURING THE SAME

(71) Applicant: Winbond Electronics Corp., Taichung (TW)

(72) Inventors: Yi-Sheng Cheng, Taichung (TW); Chien-Chang Cheng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/401,297

(22) Filed: Aug. 12, 2021

(65) Prior Publication Data
US 2022/0271042 A1 Aug. 25, 2022

(30) Foreign Application Priority Data
Feb. 25, 2021 (TW) .................. 110106821

(51) Int. Cl.
| | | |
|---|---|---|
| H01L 27/108 | (2006.01) | |
| H01L 21/285 | (2006.01) | |
| H01L 21/3213 | (2006.01) | |
| H01L 21/768 | (2006.01) | |

(52) U.S. Cl.
CPC .... *H01L 27/10844* (2013.01); *H01L 21/2855* (2013.01); *H01L 21/3213* (2013.01); *H01L 21/76843* (2013.01); *H01L 21/76865* (2013.01)

(58) Field of Classification Search
CPC ............. H01L 21/2855; H01L 21/3213; H01L 21/76843; H01L 21/76865
See application file for complete search history.

(56) References Cited

U.S. PATENT DOCUMENTS

| | | |
|---|---|---|
| 2009/0321247 A1 | 12/2009 | Cerio, Jr. et al. |
| 2018/0145080 A1* | 5/2018 | Kim .................. H01L 23/528 |

(Continued)

FOREIGN PATENT DOCUMENTS

| | | |
|---|---|---|
| CN | 1316591 | 5/2007 |
| CN | 102496597 | 6/2012 |
| TW | 201409668 | 3/2014 |

(Continued)

OTHER PUBLICATIONS

"Office Action of Taiwan Counterpart Application", dated Jul. 20, 2021, p. 1-p. 4.

*Primary Examiner* — Julia Slutsker
(74) *Attorney, Agent, or Firm* — JCIPRNET

(57) ABSTRACT

A method of manufacturing a dynamic random access memory is provided and includes: forming a hard mask layer on a substrate; forming an opening in the hard mask layer and the substrate; forming a dielectric layer on a sidewall of the opening; forming a first part of a buried word line in a lower part of the opening; forming a hard mask layer on a top surface of the hindering layer, where the hindering layer has overhangs covering top corners of the hard mask layer; depositing a first barrier layer on the substrate through hindrance of the overhangs, where the first barrier layer covers the hindering layer and a top surface of the first part and exposes the dielectric layer on the sidewall of the opening; and forming a first conductive layer in the opening, where a sidewall of the first conductive layer contacts the dielectric layer.

7 Claims, 3 Drawing Sheets

(56) References Cited

U.S. PATENT DOCUMENTS

2020/0395455 A1* 12/2020 Kim .................. H01L 29/66621
2021/0066466 A1* 3/2021 Kwon ............... H01L 27/10876

FOREIGN PATENT DOCUMENTS

| TW | 201440172 | 10/2014 |
| TW | 201440173 | 10/2014 |
| TW | 201448213 | 12/2014 |
| TW | 201906089 | 2/2019 |

* cited by examiner

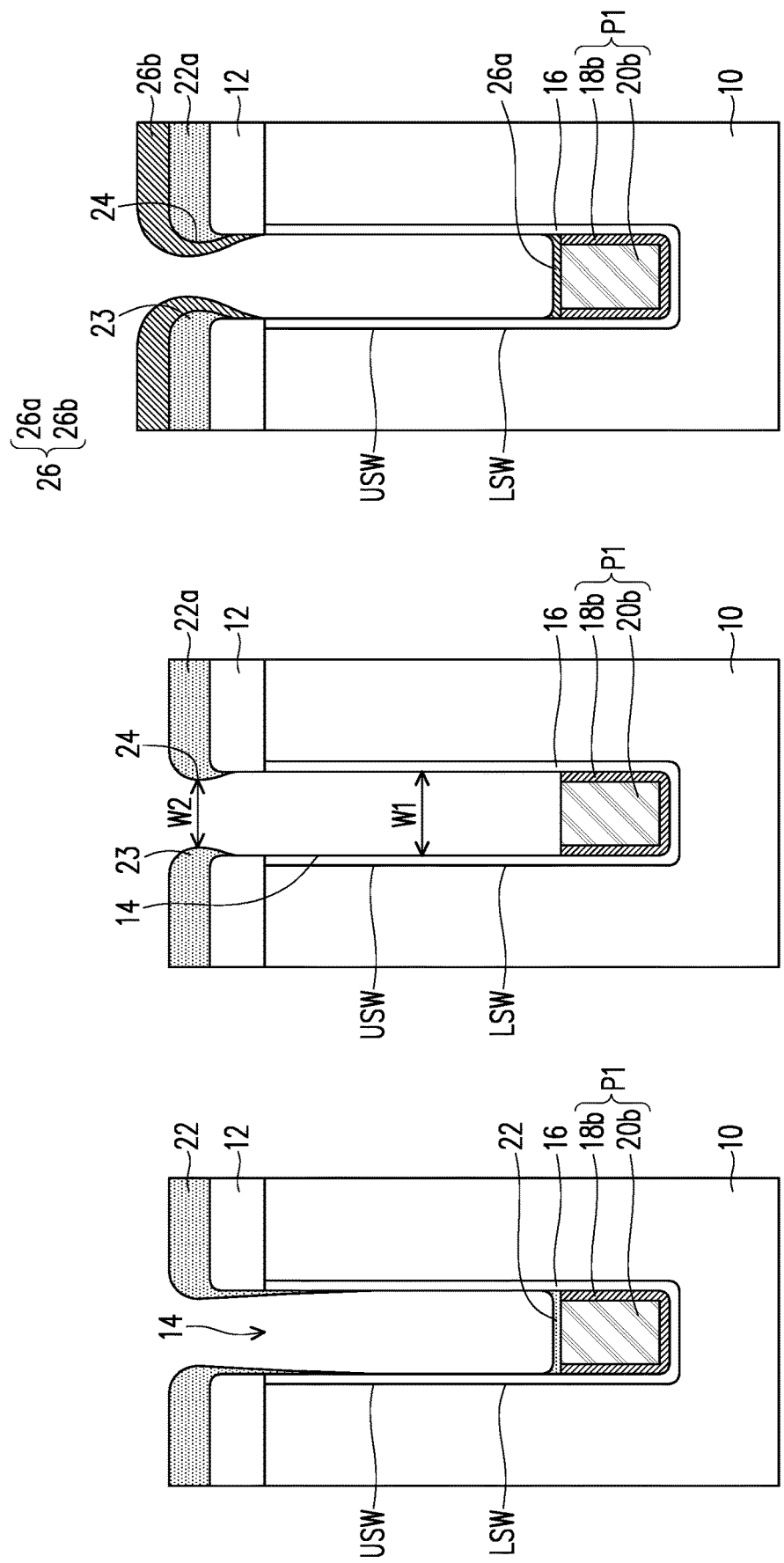

//DYNAMIC RANDOM ACCESS MEMORY AND METHOD OF MANUFACTURING THE SAME

CROSS-REFERENCE TO RELATED APPLICATION

This application claims the priority benefit of Taiwan application serial no. 110106821, filed on Feb. 25, 2021. The entirety of the above-mentioned patent application is hereby incorporated by reference herein and made a part of this specification.

BACKGROUND

Technical Field

The disclosure relates to an integrated circuit and a method of manufacturing the same, and in particular, relates to a dynamic random access memory and a method of manufacturing the same.

Description of Related Art

As the rapid development of science and technology, in order to meet the requirements of consumers for miniaturized electronic devices, the size of the dynamic random access memory (DRAM) continuously reduces and towards high integration. The buried word line DRAM has been developed in recent years, as element sizes continue to reduce, process margins drop as well. If there is metal or a barrier layer remaining on the dielectric layer of the sidewall of the buried word line trench when the buried word line is formed, the element reliability problem may occur.

SUMMARY

The disclosure provides a dynamic random access memory and a method of manufacturing the same capable of preventing metal or a barrier layer from remaining on a dielectric layer of a sidewall of a buried word line trench to improve element reliability.

An embodiment of the disclosure provides a method of manufacturing a dynamic random access memory, and the method includes the following steps. A hard mask layer is formed on a substrate. An opening is formed in the hard mask layer and the substrate. A dielectric layer is formed on a sidewall of the opening. A first part of a buried word line is formed in a lower part of the opening. A hindering layer is formed on the substrate. The hindering layer covers a top surface of the hard mask layer, and the hindering layer has overhangs covering top corners of the hard mask layer. A first barrier layer is deposited on the substrate through hindrance of the overhangs. The first barrier layer covers the hindering layer and a top surface of the first part and exposes the dielectric layer on the sidewall of the opening. A first conductive layer is formed in the opening. The first conductive layer covers a top surface of the first barrier layer, and a sidewall of the first conductive layer contacts the dielectric layer.

An embodiment of the disclosure provides a dynamic random access memory including a substrate, a first part of a buried word line, and a second part of the buried word line. The substrate has an opening, and a dielectric layer is formed on a sidewall of the opening. The first part of the buried word line is located in a lower part of the opening. The second part of the buried word line is located on the first part and includes a first barrier layer located in the opening and covering a top surface of the first part and a first conductive layer located in the opening. The first conductive layer covers a top surface of the first barrier layer, and a sidewall of the first conductive layer contacts the dielectric layer.

To sum up, the overhangs formed at the opening end may hinder deposition of the barrier layer, so that it is difficult for the barrier layer to be deposited on the sidewall of the buried word line trench. In this way, after the barrier layer is deposited, the deposition process of doped polysilicon may be directly performed. Since an etching process is not required to be performed, process steps may be saved, and the formed elements may exhibit good reliability.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1H are cross-sectional schematic views of a method of manufacturing a dynamic random access memory according to an embodiment of the disclosure.

DESCRIPTION OF THE EMBODIMENTS

Figure 1C:
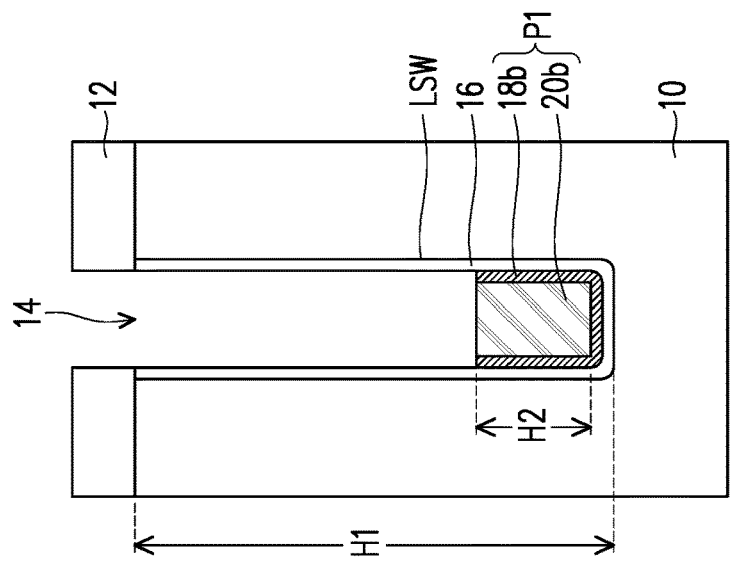
Figure 1B:
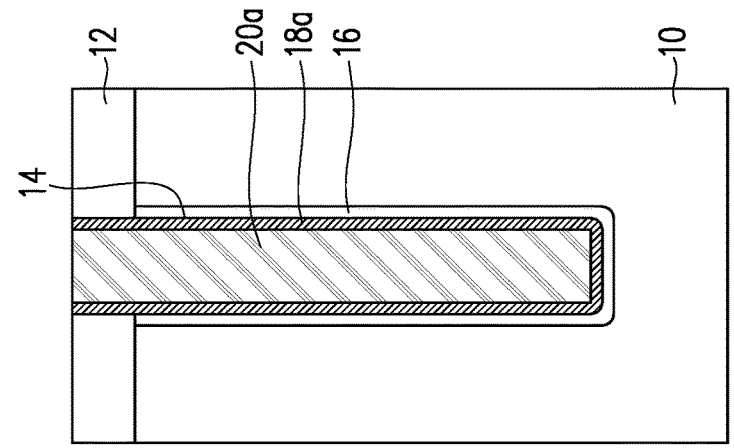
Figure 1A:
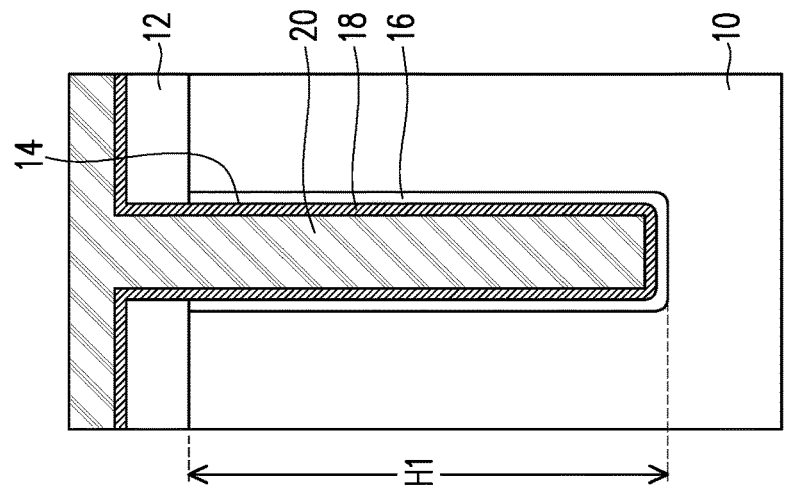

With reference to FIG. 1A, a substrate 10, such as a silicon substrate, is provided. Next, a hard mask layer 12 having an opening pattern is formed on the substrate 10. The hard mask layer 12 is formed, for example, by forming a hard mask material layer first. Next, the hard mask material layer is patterned through lithography and etching processes. A material of the hard mask material layer is, for example, silicon oxide. The hard mask layer 12 is then treated as a mask to perform an etching process, and a portion of the substrate 10 is removed to form an opening 14. The opening 14 is, for example, a trench, a buried word line trench 14 is treated as an example of the opening 14 for illustration. A depth H1 of the buried word line trench 14 is, for example, 110 nm to 130 nm. An aspect ratio of the buried word line trench 14 is, for example, 3 nm to 10 nm.

With reference to FIG. 1A, a dielectric layer 16, a barrier layer 18, and a conductive layer 20 are formed on the hard mask layer 12 and in the buried word line trench 14. The dielectric layer 16 is conformally formed on an inner surface of the buried word line trench 14. The dielectric layer 16 may be an oxide layer, such as silicon oxide, and a method of forming the dielectric layer 16 is, for example, an in-situ steam generation (ISSG) method. The barrier layer 18 may also be called as an adhesive layer. The barrier layer 18 may be a single layer or multiple layers, and a material thereof includes metal or metal alloy, such as titanium, titanium nitride, tantalum, tantalum nitride, or a combination thereof. A material of the conductive layer 20 includes metal or metal alloy, such as tungsten.

With reference to FIG. 1B, an etching process or a chemical mechanical polishing process is performed to remove the barrier layer 18 and the conductive layer 20 on the hard mask layer 12, and a barrier layer 18$a$ and a conductive layer 20$a$ are remained in the buried word line trench 14.

With reference to FIG. 1C, an etch-back process is performed to partially remove the barrier layer 18$a$ and the conductive layer 20$a$, so that a remained barrier layer 18$b$ and a remained conductive layer 20*b* are respectively located on a lower sidewall LSW and a bottom portion of the buried word line trench 14. A height H2 of the remained conductive layer 20*b* is, for example, approximately ¼ to ⅓ of the depth H1 of the buried word line trench 14. In some embodiments, the height H2 of the remained conductive layer 20*b* is between, for example, 50 nm and 60 nm. The conductive layer 20*b* and the barrier layer 18*b* are located on a lower part of the buried word line trench 14 to act as a first part P1 of a buried word line.

With reference to FIG. 1D, a hindering layer 22 is formed on the substrate 10. The hindering layer 22 has an unfavorable step coverage, and top corners of the buried word line trench 14 have overhangs 23. The hindering layer 22 covers a top surface of the hard mask layer 12 and covers a sidewall of the hard mask layer 12, a sidewall of the buried word line trench 14, and upper surfaces of the barrier layer 18*b* and the conductive layer 20*b*. A material of the hindering layer 22 includes a dielectric material, such as silicon oxide. A method of forming the hindering layer 22 is, for example, a plasma enhanced chemical vapor deposition method.

With reference to FIG. 1E, an upper sidewall USW covering on the buried word line trench 14 and the hindering layer 22 on the barrier layer 18*b* and the conductive layer 20*b* are removed to expose the sidewall of the hard mask layer 12, the upper sidewall USW of the buried word line trench 14, and top surfaces of the barrier layer 18*b* and the conductive layer 20*b*. A remained hindering layer 22*a* covers the top surface of the hard mask layer 12. The hindering layer 22*a* further includes the overhangs 23 covering the top corners of the hard mask layer 12. A width W2 of an opening 24 between the overhangs 23 is less than the width W1 of the buried word line trench 14.

With reference to FIG. 1F, a barrier layer 26 is formed on the substrate 10. The barrier layer 26 may be a single layer or multiple layers, and a material thereof includes metal or metal alloy, such as titanium, titanium nitride, tantalum, tantalum nitride, or a combination thereof. The barrier layer 26 may be formed through a physical vapor deposition method, such as a sputtering method. The barrier layer 26 includes a barrier layer 26*a* and a barrier layer 26*b*. The barrier layer 26*a* covers a top surface and a sidewall of the hindering layer 22*a* or further covers the sidewall of the hard mask layer 12. The barrier layer 26*b* is filled in the buried word line trench 14 and covers the top surfaces of the barrier layer 18*b* and the conductive layer 20*b*. Since the overhangs 23 of the hindering layer 22*a* hinder a direction of deposition of the barrier layer 26, it is difficult for the barrier layer 26 to be formed on the upper sidewall USW of the buried word line trench 14 close to the barrier layer 26*b*. Little or no barrier layer 26 is deposited on a sidewall of the dielectric layer 16 on the upper sidewall USW of the buried word line trench 14 away from the barrier layer 26*b*. No barrier layer 26 is deposited on the sidewall of the dielectric layer 16 close to the barrier layer 26*b*, so the barrier layer 26*a* and the barrier layer 26*b* are separated from each other. A thickness of the barrier layer 26 is, for example, 2 nm to 3 nm.

Figure 1H:
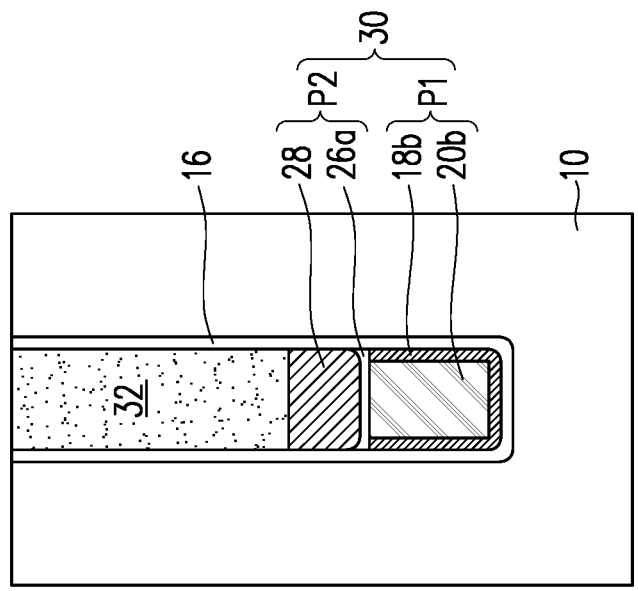
Figure 1G:
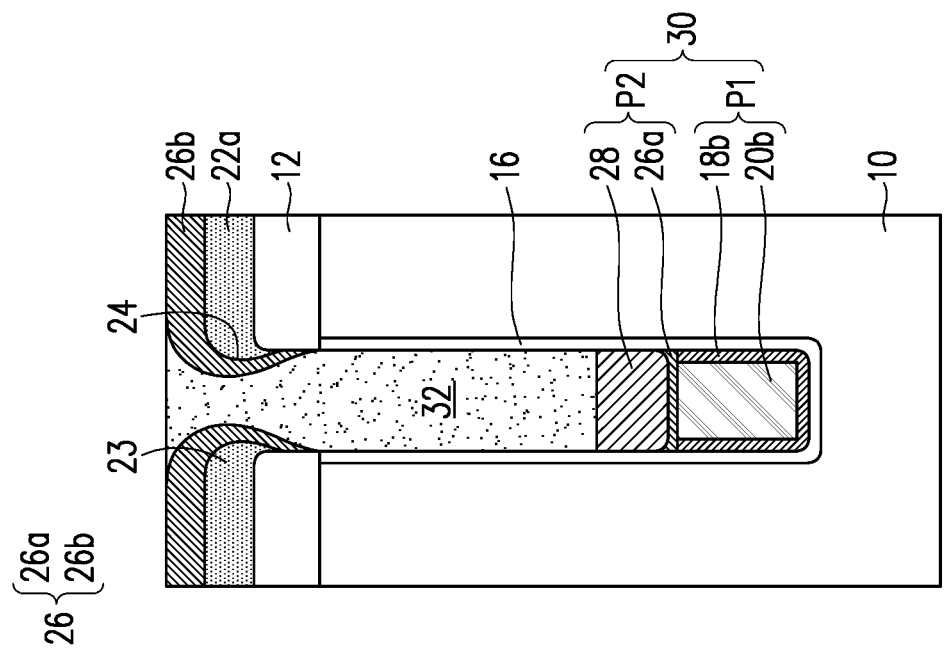

With reference to FIG. 1G, since the barrier layer 26*a* and the barrier layer 26*b* are separated from each other, an etching process is not required to be performed to remove the barrier layer 26 on the upper sidewall USW of the buried word line trench 14, and the following deposition process may be directly performed. Next, a conductive layer 28 is formed in the buried word line trench 14. A material of the conductive layer 28 is different from that of the conductive layer 20. In some embodiments, the conductive layer 20 is metal or metal alloy, and the conductive layer 28 is doped polysilicon. A bottom surface of the conductive layer 28 covers and contacts the barrier layer 26*b*, and a sidewall of the conductive layer 28 contacts the dielectric layer 16. The conductive layer 28 may be formed by depositing and etching back a doped polysilicon layer. The conductive layer 28 is, for example, 10 nm to 20 nm. The conductive layer 28, the barrier layer 26*a*, the barrier layer 18*b*, and the conductive layer 20*b* form a buried word line 30. The barrier layer 18*b* and the conductive layer 20*b* act as a first part P1 of the buried word line 30 together, and the conductive layer 28 and the barrier layer 26*a* act as a second part P2 of the buried word line 30 together. Resistance of the conductive layer 20*b* of the first part P1 is less than that of the conductive layer 28, and the conductive layer 20*b* is separated from the dielectric layer 16 through the barrier layer 18*b*. The conductive layer 28 of the second part P2 contacts the dielectric layer 16 and is separated from the conductive layer 20*b* through the barrier layer 26*a*.

With reference to FIG. 1G, an insulating layer 32 is formed in the buried word line trench 14. A material of the insulating layer 32 is, for example, silicon nitride. The insulating layer 32 is formed by, for example, depositing and etching back an insulating material layer.

With reference to FIG. 1H, a planarization process is performed to remove the hindering layer 22*a*, the barrier layer 26*a*, and the insulating layer 32 on the hard mask layer 12.

In view of the foregoing, in the disclosure, before the barrier layer is deposited, the hindering layer having the overhangs are formed first on the substrate. Through hindrance of the overhangs, it is difficult for the barrier layer to be deposited on the sidewall of the buried word line trench. Therefore, after the barrier layer is deposited, the deposition process of doped polysilicon may be directly performed. Since an etching process is not required to be performed, process steps may be saved, and the formed elements may exhibit good reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a dynamic random access memory, comprising:
    forming a hard mask layer on a substrate;
    forming an opening in the hard mask layer and the substrate;
    forming a dielectric layer on a sidewall of the opening;
    forming a first part of a buried word line in a lower part of the opening;
    forming a hindering material layer on the substrate, wherein the hindering material layer covers a top surface of the hard mask layer, a sidewall of the hard mask layer, a portion of a sidewall of the dielectric layer, and a top surface of the first part,
    removing the hindering material layer on the sidewall of the dielectric layer and the top surface of the first part to form a hindering layer on the substrate, wherein the hindering layer covers the top surface of the hard mask layer, and the hindering layer has overhangs covering top corners of the hard mask layer;
    depositing a first barrier layer on the substrate through hindrance of the overhangs, wherein the first barrier layer covers the hindering layer and the top surface of the first part and exposes the dielectric layer on the sidewall of the opening; and forming a first conductive layer in the opening, wherein the first conductive layer covers a top surface of the first barrier layer, and a sidewall of the first conductive layer contacts the dielectric layer.

2. The method of manufacturing the dynamic random access memory according to claim 1, wherein the first conductive layer is formed in the opening right after the first barrier layer is deposited on the substrate.

3. The method of manufacturing the dynamic random access memory according to claim 1, wherein a method of depositing the first barrier layer on the substrate comprises a physical vapor deposition method.

4. The method of manufacturing the dynamic random access memory according to claim 1, wherein a method of forming the hindering material layer on the substrate comprises a plasma enhanced chemical vapor deposition method.

5. The method of manufacturing the dynamic random access memory according to claim 1, wherein the step of forming the first part of the buried word line in the lower part of the opening comprises:

forming a second barrier layer in the opening; and forming a second conductive layer in the opening, wherein a material of the second conductive layer and a material of the first conductive layer are different.

6. The method of manufacturing the dynamic random access memory according to claim 1, further comprising filling the opening with an insulating layer to cover the first conductive layer.

7. The method of manufacturing the dynamic random access memory according to claim 1, further comprising removing the hard mask layer, the hindering layer disposed thereon, and the first barrier layer.

* * * * *